United States Patent
Stevens et al.

(10) Patent No.: US 6,917,323 B2
(45) Date of Patent: Jul. 12, 2005

(54) ANALOGUE TO DIGITAL CONVERTER

(75) Inventors: Roderick Leonard Wallace Stevens, Eastleigh (GB); Robin Granger, Southampton (GB)

(73) Assignee: Roke Manor Research Limited, Romsey (GB)

( * ) Notice: Subject to any disclaimer, the term of this patent is extended or adjusted under 35 U.S.C. 154(b) by 0 days.

(21) Appl. No.: 10/474,001

(22) PCT Filed: Mar. 28, 2002

(86) PCT No.: PCT/EP02/03596
§ 371 (c)(1),
(2), (4) Date: Oct. 6, 2003

(87) PCT Pub. No.: WO02/082659
PCT Pub. Date: Oct. 17, 2002

(65) Prior Publication Data
US 2004/0108948 A1 Jun. 10, 2004

(30) Foreign Application Priority Data
Apr. 7, 2001 (GB) .............................. 0108829

(51) Int. Cl.$^7$ ................................. H03M 1/12
(52) U.S. Cl. ....................................... 341/155
(58) Field of Search ................. 341/155, 138, 341/133, 143

(56) References Cited

U.S. PATENT DOCUMENTS 3,991,409 A * 11/1976 Dautremont et al. ........ 365/197
4,411,002 A 10/1983 Auger
4,595,909 A 6/1986 Jarrett
4,983,972 A 1/1991 Mills
5,010,340 A 4/1991 Green
5,157,398 A 10/1992 Okazaki et al.
6,157,329 A * 12/2000 Lee et al. .................... 341/133

FOREIGN PATENT DOCUMENTS

| EP | 0 935 386 A | 11/1999 |
| GB | 1207747 | 7/1970 |
| GB | 2102643 A | 2/1983 |
| GB | 2115247 A | 9/1983 |
| GB | 2115998 A | 9/1983 |

OTHER PUBLICATIONS

Search Report Dated May 9, 2001.

* cited by examiner

Primary Examiner—Jean Bruner Jeanglaude
(74) Attorney, Agent, or Firm—Crowell & Moring LLP

(57) ABSTRACT

An analog to digital converter (ADC) includes a comparator, N×1-bit clocked shift register and a clock which is phase-locked to the input signal. The system according to the invention includes such an ADC, together with processing means. The ADC samples an input waveform and the processing means determines a correction waveform, converts the correction waveform to an analog signal, combines the correction waveform with the input waveform to control its envelope and outputs a combined waveform. The combined waveform is substantially flat.

6 Claims, 2 Drawing Sheets

ANALOGUE TO DIGITAL CONVERTER

RELATED APPLICATIONS

This application is the national phase under 35 U.S.C. 371 of PCT International No. PCT/JP02/03596 which has an International filing date of Mar. 28, 2002 which claims priority based on United Kingdom Application No. 0108829.03 filed on Apr. 7, 2001.

BACKGROUND OF THE INVENTION

This invention relates to an analog to digital converter and a system for controlling the envelope of a periodic waveform using such a converter.

Conventional commercially available integrated circuit analog to digital converters are only able to digitize signals up to approximately 1 GHz bandwidth. However, there is a requirement for digitizing wide bandwidth periodic analog electrical signals in a system that corrects ripple on the input signal. Such signals typically have a 5 GHz bandwidth or greater, which existing systems cannot deal with. In specialist test equipment, wide bandwidth signals up to 50 GHz have been digitized, but the equipment is bulky, costly and has a high power requirement. These drawbacks make this type of equipment unsuitable for use in tightly integrated, low-power systems. Such prior art ADCs operate by sampling the input signal over a very short time window, and digitizing the sample with a high resolution ADC that does not have the required input bandwidth. 'Equivalent-time sampling' is a technique that can then be used to measure the complete waveform.

There are existing A/D converters which operate by splitting an input signal into multiple signals and sampling these in parallel. This creates multiple high fidelity copies of the input signal. However, this method cannot be used at microwave frequencies because of difficulties in sampling all the channels together.

SUMMARY OF THE INVENTION

In accordance with a first aspect of the present invention, an analog to digital converter (ADC) comprises a comparator; an N×1-bit clocked shift register; and a clock, wherein the clock is phase-locked to the input signal.

The present invention is able to take fast samples of the input signal, convert them to digital signals and subsequently store them in the shift register. The stored digital patterns may then be transmitted in parallel format at a significantly lower rate. The sampled signals can then be combined to build up a complete waveform. The benefits of having the clock phase-locked to the input waveform are that the representation of the input waveform can be built up over many repetitions of it, relaxing the requirements of the individual components comprising the ADC implementation.

Preferably, the clock is a fixed frequency clock and the clock frequency is in the range of 1 GHz to 50 GHz. Using a fixed frequency clock gives better jitter performance, since the sample interval is determined by the fixed frequency clock, rather than an incremental delay as used in conventional ADC. The clock frequency can certainly be lower than 10 GHz (e.g. 1 GHz) without losing one of the essential features of the invention—that it can be realized using readily available low-cost commercially available components. However at lower clock frequencies e.g. 10 kHz; alternative solutions are readily available because the problems of microwave operation do not apply.

Preferably, a threshold voltage applied to the comparator is varied in order to characterized an envelope of an input signal. Alternatively, a threshold voltage applied to the comparator is alternated between two nominated voltages, such that an envelope of an input signal is characterized more efficiently. Where the threshold voltage is fixed, a variable bias voltage may be applied to the input signal.

The ADC has a 1 bit resolution, but by varying the threshold level, it is possible to build up a more accurate representation of the signal. This is quite different from the mode of operation of prior art ADC's in the frequency range of interest.

Typically, the threshold voltage is generated by a processor controlled digital to analog converter (DAC) circuit.

The input signal may have a bandwidth from d.c. up to 50 GHz, and even higher frequencies may be possible, but preferably, the input signal has a bandwidth in the range 1 GHz to 50 GHz.

Operating at microwave frequencies requires accurate matching of all components in the system because the clock can be delayed by as much as the signal length. This problem does not occur at lower frequencies. One of the "hidden features" of prior-art "low-frequency" ADC architectures is that the propagation delay between the various discrete components is insignificant to overall operation. This is a key limitation when attempting to extend these techniques into the microwave domain, where the propagation delay between components can often exceed whole cycles of the ADC clock. Implementing an ADC at these microwave frequencies using existing prior-art ADC architectures with low-cost commercially available components is therefore impractical. This limitation is overcome in the system proposed in the present invention.

In accordance with a second aspect of the present invention, a system for controlling the envelope of a periodic waveform comprises an ADC according to the first aspect and processing means, whereby the ADC samples an input waveform and the processing means determines a correction waveform, converts the correction waveform to an analog signal, combines the correction waveform with the input waveform to control its envelope and outputs a combined waveform, wherein the combined waveform is substantially flat.

Alternatively, the combined waveform is substantially flat for a predetermined portion of the input waveform.

In this context, flat is defined as being constrained between two threshold voltages which are applied to the comparator alternately. By setting two threshold levels, it is possible to detect excursions of the output signal from 'flat', and hence modify the correction waveform to compensate.

It is common feature of comparator/shift register designs to have a sample window which can be considerably shorter than the clock period. Thus, higher bandwidth signals can be sampled by varying the phase of the clock signal relative to the input signal. This technique is called 'equivalent-time sampling'.

In this specification, the term bandwidth refers to the maximum bandwidth of a signal which can be sampled and the term throughput refers to the number of samples which can be acquired per second.

BRIEF DESCRIPTION OF THE DRAWINGS

An example of an analog to digital converter and a system for controlling the envelope of a periodic waveform according to the present invention will now be described with reference to the accompanying drawings in which.

DETAILED DESCRIPTION OF THE DRAWINGS

Figure 1:
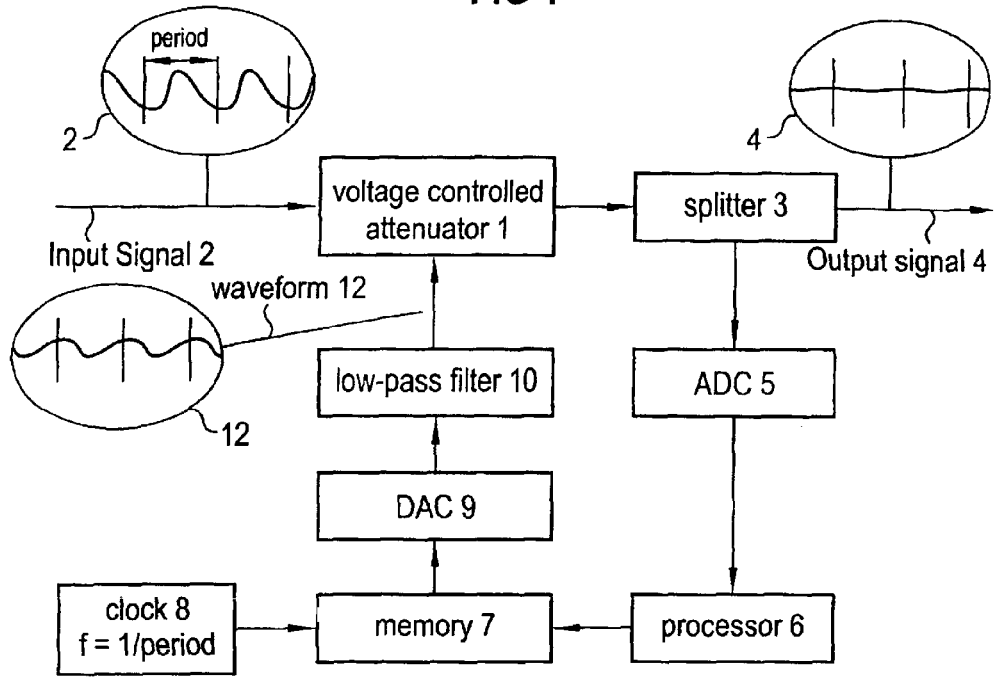
FIG. 1 illustrates a system for controlling the envelope of a periodic waveform.

One example of a system according to the present invention is shown in FIG. 1. The system comprises a voltage-controlled attenuator 1 which receives an input signal 2. The input signal 2 has peaks and troughs which need to be flattened out to produce a substantially constant output level. An output from the attenuator 1 is split in a splitter 3, so that one output of the splitter forms the output signal 4 and another output from the splitter is input to an analog to digital converter (ADC) 5 in accordance with the invention. A digital signal output from the ADC 5 is processed by a processor 6, input to memory 7 and under control of a clock 8, successive values in the memory 7 are passed through a digital to analog converter (DAC) 9, filtered by a low pass filter 10 and the filtered signal applied to the control input of the voltage controlled attenuator 1.

The system operates by sampling a portion of the output from the attenuator 1 and digitizing the sampled signal. The loop bandwidth is greater than any variation in input signal between successive periods. Because of this the system is able to track any variations, and thus produce a substantially flat output. Because the output is substantially flat, an ADC with only one bit resolution is required to characterise it, thus simplifying the hardware. The processor 6 calculates a correction waveform which when combined with the input waveform produces a substantially constant waveform. Data representing the correction waveform is passed to the memory 7. Successive values in memory are passed to the DAC 9 at a rate which is controlled by the clock 8 which is phase-locked to the input signal 2. The resulting analog waveform is then low-pass filtered by filter 10 to produce waveform 12 which is used to control the attenuator 1, and thus to control the shape of the output signal 4.

Figure 2A:
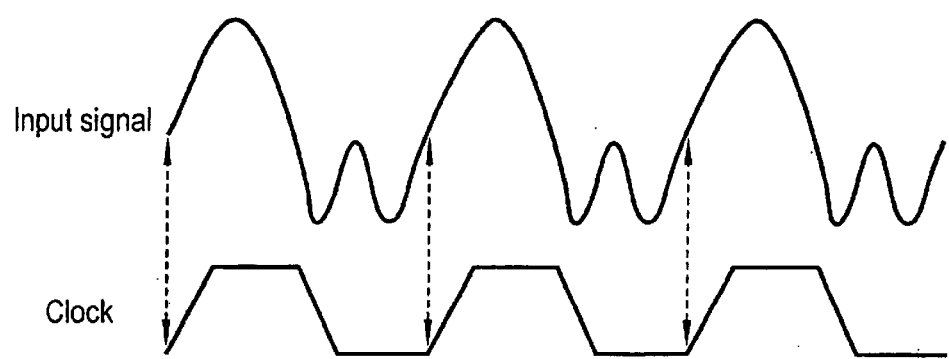
FIG. 2 illustrates examples of how the clock is phase locked to the input signal; and, FIG. 3 illustrates a digital to analog converter according to the present invention for use in the system of FIG. 1.
Figure 2B:
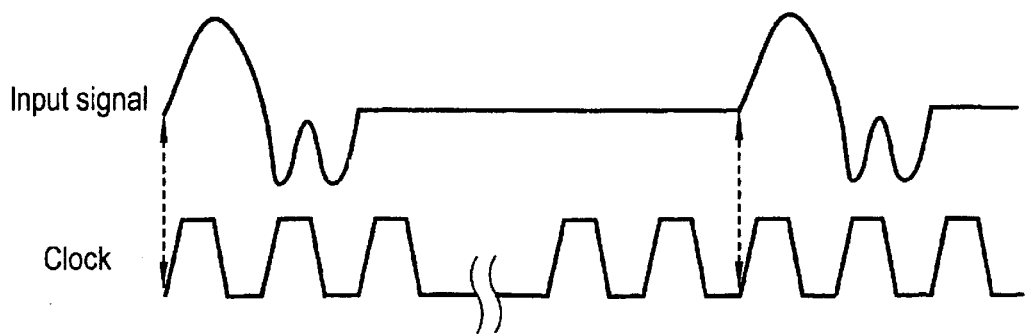

In FIG. 2a, a first example of how the clock is phase-locked to the input signal is shown. In this case, it can be seen that both the input signal and the clock are similarly regular and each clock cycle coincides with a similar point on a cycle of the input signal. In FIG. 2b, the input signal is still regular, but it is spread out over a longer period of time, so that the repetition occurs after several clock cycles, rather than every one.

A particular feature of this invention is the design of the ADC 5. Conventional ADC integrated circuits are capable of digitizing signals with bandwidths up to approximately 1 GHz. However, there is a requirement to digitize periodic analog electrical signals for which these conventional ADC integrated circuits are not suitable, for example, flattening the waveform produced by a pulsed chirp laser. This is particularly applicable to telecomms applications. Analog to digital conversion systems, which are capable of sampling up to 50 GHz bandwidth, have been produced but these are bulky and expensive, so are not suitable for this application. Also, because they are not available as integrated circuits due to their complexity and high performance, they cannot be incorporated easily into existing system designs. These conventional ADC's rely on equivalent-time sampling techniques to achieve the required bandwidth.

Figure 3:
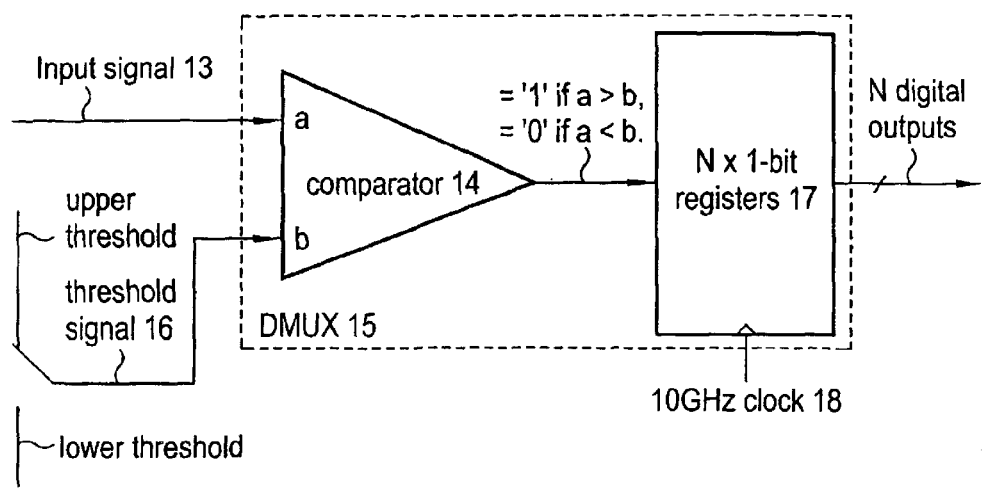

The present invention overcomes the problems of conventional systems dealing with wide bandwidth signals by using a demultiplexer circuit as a combined 1 bit ADC (or comparator) and N×1-bit register, as shown in FIG. 3. In this particular example, the demultiplexer (DMUX) 15 is a 16:1 DMUX (i.e. N=16) operating at approximately 10 GHz, but higher clock rates, e.g. 40 GHz, and other ratios, e.g. 4:1 or 2:1 are also currently available. A sampled signal 13 from the splitter 3 is applied to input a of the comparator 14 in the DMUX 15. A threshold signal 16 is applied to input b of the comparator 14. The threshold signal voltage may be generated by a DAC circuit under control of the processor 6. The sampled waveform is periodic, so that it is not essential to sample every single cycle. This feature allows a low speed DAC to be used to generate the threshold signal voltage, because samples can be discarded whilst the DAC settles. The output of the comparator 14 is logical "1" if input a is greater than input b and logical "0" otherwise. The output values are stored sequentially in the 16×1-bit register 17 on successive rising edges of the clock 18.

In a preferred mode of operation, 1-bit digitized samples of the analog input signal from the register 17 are sent to the processor 6, sixteen at a time corresponding to sixteen consecutive samples. The processor 6 can then determine which portions of the waveform are above or below the threshold voltage and alter the values in the memory 7 accordingly thus changing the correction waveform. By setting alternately high and low threshold voltages, the output signal can be constrained between the two threshold levels.

An alternative mode of operation requires only one threshold level 16 to be set. In this mode the processor 6 counts the number of ones and zeros corresponding to the same sample instant in the cycle. The ratio of ones to zeros is used to determine the appropriate corresponding value in the memory 7; thus changing the correction waveform to maintain the ratio at approximately 50:50.

The system of the present invention produces an output signal which is substantially flat. An alternative is to produce an output signal which is substantially flat for a particular portion of its period by modifying selected entries in the memory 7.

Amongst the advantages of the ADC of the present invention are that it uses a small, low-cost, low-power commercially available device compared to existing ADC's which operate at these bandwidths; it offers improved jitter performance since the sample interval is determined by a fixed-frequency clock, rather than the conventional method of using an incremental delay; and it offers full bandwidth performance at 1-bit resolution as compared with the significantly smaller bandwidths offered by conventional devices, albeit at higher resolution.

The foregoing disclosure has been set forth merely to illustrate the invention and is not intended to be limiting. Since modifications of the disclosed embodiments incorporation the spirit and substance of the invention may occur to persons skilled in the art, the invention should be construed to include everything within the scope of the apppended claims and equivalents thereof.

What is claimed is:

1. An analog to digital converter (ADC) comprising:

a comparator;

an N×1-bit clocked shift register; and a clock; wherein, the clock is phase-locked to a periodic input signal;

a threshold voltage applied to the comparator is varied in order to characterize an envelope of an input signal;

the clock frequency is in the range of 1 GHz to 50 GHz;

the input signal has a bandwidth between dc and 50 GHz; and each digital output signal from the shift register is independent of an output generated in response to a previous input signal.

2. An ADC according to claim 1, wherein the clock is a fixed frequency clock.

3. An ADC according to claim 1, wherein a threshold voltage applied to the comparator is alternated between two nominated voltages, such that an envelope of an input signal is characterized more efficiently.

4. An ADC according to claim 1, wherein the threshold voltage is generated by a processor controlled digital to analog converter circuit.

5. A system for controlling the envelope of a periodic waveform, the system comprising:

an analog to digital converter (ADC), including a comparator, an N×1-bit clocked shift register, and a clock; wherein, the clock is phase-locked to the input signal; a threshold voltage applied to the comparator is varied in order to characterize an envelope of an input signal; the clock frequency is in the range of 1 GHz to 50 GHz; and wherein the input signal has a bandwidth between dc and 50 GHz; and processing means; wherein, the ADC samples an input waveform;

the processing means determines a correction waveform, converts the correction waveform to an analog signal, combines the correction waveform with the input waveform to control its envelope and outputs a combined waveform; and the combined waveform is substantially flat.

6. A system according to claim 5 wherein the combined waveform is substantially flat for a predetermined portion of the input waveform.

* * * * *